United States Patent [19]

Takada et al.

[11] Patent Number: 4,558,226
[45] Date of Patent: Dec. 10, 1985

[54] VOLTAGE DETECTING CIRCUIT WITH HYSTERESIS CHARACTERISTIC AND HIGH NOISE IMMUNITY

[75] Inventors: Junji Takada; Masayuki Minamitake; Satoshi Tamegai, all of Yokohama, Japan

[73] Assignees: Tokyo Shibaura Denki Kabushiki Kaisha, Kawasaki; Toshiba Components Co., Tokyo, both of Japan

[21] Appl. No.: 511,280

[22] Filed: Jul. 6, 1983

[30] Foreign Application Priority Data

Jul. 7, 1982 [JP] Japan .................................. 57-117931

[51] Int. Cl.⁴ ............................................. G01R 31/00
[52] U.S. Cl. .................... 250/551; 250/214 R; 307/252 N; 307/252 UA; 324/96
[58] Field of Search ........................ 250/551, 214 R; 307/252 N, 252 J, 252 W, 252 UA; 324/96

[56] References Cited

U.S. PATENT DOCUMENTS 3,812,382  5/1974  Pascente ................... 307/252 UA
3,854,089  12/1974  Emler ........................... 324/96

FOREIGN PATENT DOCUMENTS 2142711  5/1974  Fed. Rep. of Germany .
0610304  5/1978  U.S.S.R. ............................ 307/311

OTHER PUBLICATIONS

Taschenbuch Elektrotechnik, vol. 1, published by Karl Hanser-Verlag, Munich, Vienna, 1976, pp. 707–708.
Tietze-Schenk, "Halbleiterschaltungstechnik", 3rd edition, published by Springer Verlag 1974, pp. 114–117.

Primary Examiner—Edward P. Westin
Attorney, Agent, or Firm—Finnegan, Henderson, Farabow, Garrett & Dunner

[57] ABSTRACT

A voltage detecting circuit includes an input circuit section including a light emitting diode and a current supplying circuit for supplying a current to this light emitting diode in response to an input voltage, and an output circuit section for generating an output voltage in response to the light emitted from the light emitting diode. This output circuit section includes a phototransistor which, together with the light emitting diode constitutes a photocoupler. A characteristic between the input voltage and the output current of the current supplying circuit represents a hysteresis characteristic.

9 Claims, 10 Drawing Figures

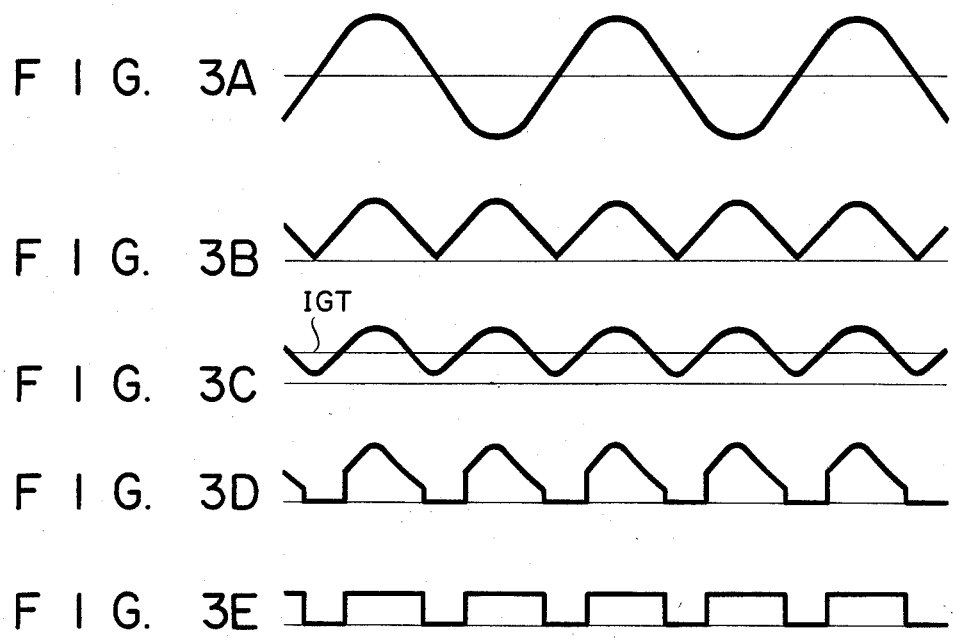
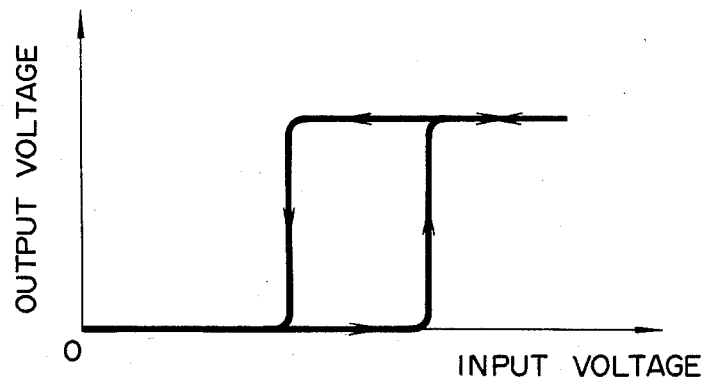

VOLTAGE DETECTING CIRCUIT WITH HYSTERESIS CHARACTERISTIC AND HIGH NOISE IMMUNITY

BACKGROUND OF THE INVENTION

This invention relates to a voltage detecting circuit for generating an output voltage in response to an input voltage.

Conventionally, in industrial equipment which uses microcomputers such as numerical controllers, industrial robots, etc., a voltage detecting circuit is used which includes an input circuit section to detect a voltage applied to a predetermined load and an output circuit section, which is coupled to this input circuit section by means of photocoupling, to generate a control signal in accordance with the result of voltage detection of this input circuit section. FIG. 1 shows an example of such a type of conventional voltage detecting circuit. This voltage detecting circuit includes an input circuit section 2 to which a voltage to be detected will be applied and an output circuit section 4 coupled to this input circuit section 2 by means of photocoupling. This input circuit section 2 has a full-wave rectifying circuit 6 to rectify an AC input voltage applied across the input terminals, a resistive voltage dividing circuit 8 to divide an output voltage of this full-wave rectifying circuit 6, and a series circuit of Zener diode ZD and light emitting diode D1 which is connected between the output terminals of this voltage dividing circuit 8.

The output circuit section 4 includes a pnp transistor TR1 having an emitter connected to a power source terminal VC and a collector which is grounded or connected to a power source terminal VS through a resistor R1, and an npn phototransistor TR2 having a collector which is connected to the power source terminal VC through a resistor R2 and which is connected to a base of the transistor TR1 through a resistor R3 and an emitter connected to the power source terminal VS. This phototransistor TR2 together with a light emitting diode D1 constitutes a photocoupler.

When an AC voltage with a smaller amplitude than a predetermined value is applied to the full-wave rectifying circuit 6, the Zener diode ZD is turned off and no current will flow through the light emitting diode D1, so that the light emitting diode D1 will not light up. Thus, the transistors TR1 and TR2 remain non-conductive, and an output voltage between the output terminal VO and the power source terminal VS is kept at a low level. When an AC voltage with a larger amplitude than the predetermined value is applied to the full-wave rectifying circuit 6, the Zener diode ZD is turned on, so that a large enough current will flow through the light emitting diode D1 for successful light emission. Hence, the phototransistor TR2 is made conductive in response to the light emitted from this light emitting diode D1, and the transistor TR1 is also made conductive. Therefore, an output voltage between the output terminal VO and the power source terminal VS will be at a high level.

However, since a Zener voltage of the Zener diode ZD is constant, a fluctuation of the output voltage of the voltage dividing circuit 8 due to noise or the like from the outside may cause a malfunction in the Zener diode ZD. For example, when an output voltage from the voltage dividing circuit 8 is lower than a predetermined level and the Zener diode ZD is turned off, if a noise voltage is added to the output voltage of this voltage dividing circuit 8, the Zener diode ZD will be turned on, resulting in the light emission of the light emitting diode D1.

SUMMARY OF THE INVENTION

An object of this invention is to provide a voltage detecting circuit which will hardly be affected by noise, thereby attaining stable operation.

This object is accomplished by a voltage detecting circuit comprising an input circuit section including a light emitting element and a current supplying circuit for supplying a current to this light emitting element in response to an input voltage and having a hysteresis characteristic with respect to the input voltage; and an output circuit section including a light receiving element which, together with the light emitting element, constitutes a photocoupler, for generating an output signal in response to the light emitted from the light emitting element.

BRIEF DESCRIPTION OF THE DRAWINGS

FIGS. 3A to 3E show signal waveforms for describing the operation of the voltage detecting circuit shown in FIG. 2;

FIG. 4 shows an input-output voltage characteristic of the voltage detecting circuit shown in FIG. 2;

DETAILED DESCRIPTION OF THE PREFERRED EMBODIMENT

Figure 2:
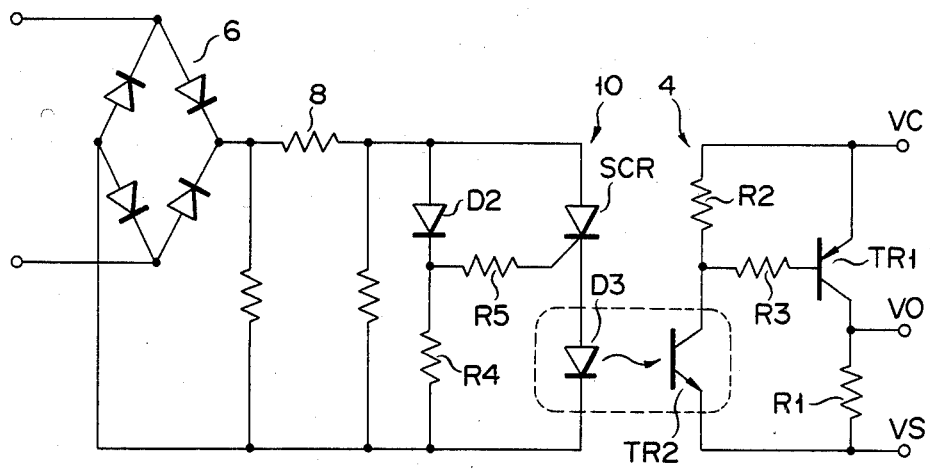
FIG. 2 is a circuit diagram of a voltage detecting circuit in an embodiment of this invention.

FIG. 2 shows a circuit diagram of a voltage detecting circuit in an embodiment according to the present invention. This voltage detecting circuit has an input circuit section 10 to which a voltage to be detected will be applied and an output circuit section 4 coupled to this input circuit section 10 by means of photocoupling. The input circuit section 10 includes a full-wave rectifying circuit 6 connected across a load (not shown) to rectify an AC voltage applied across this load; a resistive voltage dividing circuit 8 to divide an output voltage of the full-wave rectifying circuit 6; a diode D2 and a resistor R4 which are connected in series between the output terminals of the voltage dividing circuit 8; and a thyristor SCR and a light emitting diode D3 which are connected in series between the output terminals of the voltage dividing circuit 8. The gate of the thyristor SCR is connected through a resistor R5 to the connection point between the diode D2 and the resistor R4. Namely, the diode D2 and the resistor R4 constitute a gate driving circuit to drive the gate of the thyristor SCR.

Figure 1:
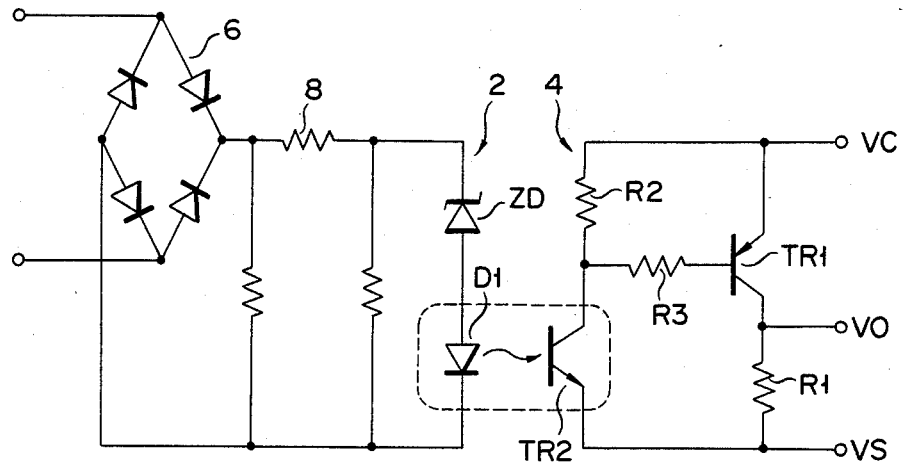
FIG. 1 is a circuit diagram of a conventional voltage detecting circuit.

The output circuit section 4 is constituted by transistors TR1 and TR2, and resistors R1 to R3 similarly to that shown in FIG. 1. This transistor TR2 is a phototransistor which, together with the light emitting diode D3, constitutes a photocoupler.

The operation of the voltage detecting circuit shown in FIG. 2 will be described hereinbelow with reference to FIGS. 3A to 3E.

When an AC voltage shown in FIG. 3A is applied to the full-wave rectifying circuit 6, a rectified voltage as shown in FIG. 3B is obtained from this full-wave rectifying circuit 6. The output voltage from this full-wave rectifying circuit 6 is divided by the voltage dividing circuit 8, and then applied across the series circuit of the diode D2 and the resistor R4. Hence, a gate trigger current IG as shown in FIG. 3C is supplied from the gate driving circuit of the diode D2 and the resistor R4 to the gate of the thyristor SCR. When an output voltage of the voltage dividing circuit 8 is high enough and a gate trigger current IG becomes larger than a turn-on current IGT, the thyristor SCR is turned on, and a current as shown in FIG. 3D will flow through the thyristor SCR. Thus, the light emitting diode D3 lights up and causes the phototransistor TR2 to become conductive. Consequently, a current flows through the transistor TR1 and the resistor R1, and an output voltage at a high level as shown in FIG. 3E is obtained from the output circuit section 4.

After that, when an output voltage of the voltage dividing circuit 8 is reduced and the current flowing through the thyristor SCR becomes smaller than a holding current, the thyristor SCR is turned off. Hence, the light emitting diode D3 stops light emission and causes the phototransistor TR2 to become non-conductive. Therefore, an output voltage from the output circuit section 4 is set at a lower level as shown in FIG. 3E. As described above, when an AC voltage with a higher amplitude than a predetermined value is supplied to the full-wave rectifying circuit 6, a pulse signal having a pulse width and a repetition rate corresponding to the amplitude and frequency of the input AC voltage is obtained from the output circuit section 4.

In the voltage detecting circuit shown in FIG. 2, when the amplitude of the input AC voltage reaches the first predetermined value and the gate trigger current IG becomes larger than the turn-on current IGT, and when a current which is larger than a latch current flows through the thyristor SCR, this thyristor SCR is kept on. That is, as shown in FIG. 4, after an AC input voltage has become higher than the first predetermined voltage, an output voltage at a high level is obtained from the output circuit section 4. This thyristor SCR remains on until the amplitude of the AC input voltage becomes lower than the second predetermined voltage, which is lower than the first predetermined voltage, and until the current flowing through the thyristor SCR becomes smaller than the holding current. In other words, a relationship between the AC input voltage and the output voltage shows a hysteresis characteristic as illustrated in FIG. 4. As a result, there is less possibility that while the thyristor SCR is on or off, an output voltage of the voltage dividing circuit 8 will fluctuate due to noise and that this will erroneously cause the thyristor SCR to be turned on or off.

Figure 5:
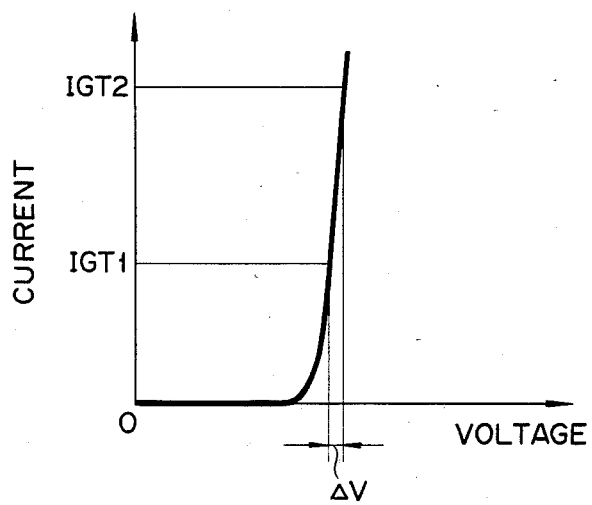
FIG. 5 shows a voltage-current characteristic of a diode for describing how a turn-on current variation of thyristor to be used in the voltage detecting circuit shown in FIG. 2 affects the operation of this voltage detecting circuit.

As shown in FIG. 5, when the amplitude of an AC input voltage is higher than a predetermined value and a forward voltage larger than the contact potential is applied to the diode D2, a forward current flows. When this forward current is larger than the turn-on current IGT, the thyristor SCR is turned on. The turn-on current IGT of this thyristor differs in dependence upon respective thyristors; for example, it indicates a value within a range of IGT1 to IGT2. However, in the voltage detecting circuit shown in FIG. 2, even if a thyristor SCR with a different turn-on current is used, the fluctuating width of the amplitude of an AC input voltage necessary to turn on this thyristor SCR will be ΔV. In other words, in the voltage detecting circuit shown in FIG. 2, even if a thyristor with a different turn-on current is used, the amplitude of the AC input voltage to turn on this thyristor will merely fluctuate within a range of ΔV, so that this will scarcely affect the operation of this voltage detecting circuit.

Figure 6:
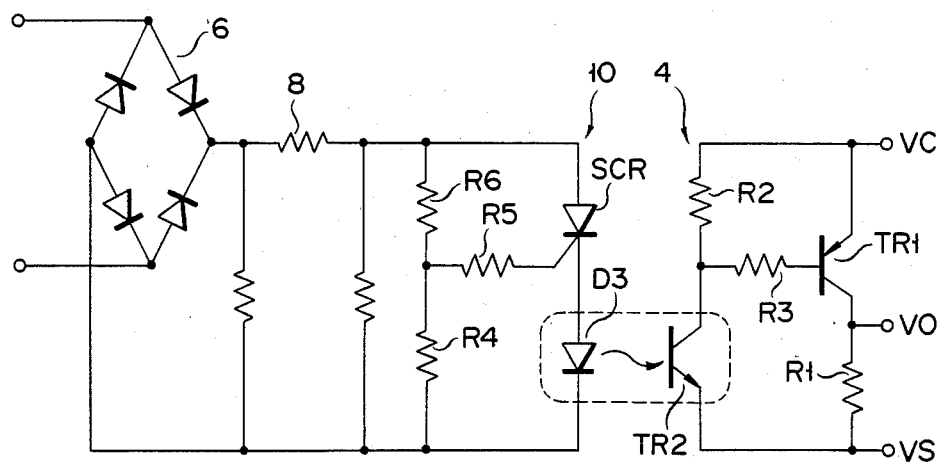
FIG. 6 shows a variation of the voltage detecting circuit shown in FIG. 2.

An embodiment of the present invention has been described above; however, the invention is not limited to this embodiment. For instance, as shown in FIG. 6, a resistor R6 may be used in place of the diode D2. The voltage detecting circuit shown in FIG. 6 will be easily affected due to a variation of a turn-on current IGT of the thyristor SCR as compared with that shown in FIG. 2. However, a similar effect to that shown in FIG. 2 will be obtained since a hysteresis characteristic is derived between the input and output voltages as shown in FIG. 4.

It may be possible to use a unidirectional circuit element such as a plurality diodes connected in series, one or more Zener diodes connected in series or the like in place of the diode D2.

Furthermore, a DC input voltage may be applied to the input circuit section 10 by omitting the rectifying circuit 6. The voltage dividing circuit 8 may be omitted if necessary.

What is claimed is:

1. A voltage detecting circuit comprising:
   an input circuit section indluding light emitting means and current supplying means for supplying a current to said light emitting means in response to an input voltage and having a hysteresis characteristic with respect to the input voltage; said current supplying means comprising a thyristor having a gate and an anode-cathode path connected in series to said light emitting means, and a gate driving circuit for driving the gate of said thyristor; and
   an output circuit section including light receiving means optically coupled to said light emitting means, and signal generating means connected to said light receiving means for generating an output signal in response to the light emitted from said light emitting means.

2. A voltage detecting circuit according to claim 1, wherein said current supplying means comprises a rectifying circuit for rectifying an input voltage and a voltage dividing circuit for dividing an output voltage of said rectifying circuit to supply a divided output voltage to said gate driving circuit.

3. A voltage detecting circuit according to claim 1, wherein said current supplying means further includes a voltage dividing circuit for dividing an input voltage to supply a divided output voltage to said gate driving circuit.

4. A voltage detecting circuit according to claim 3, wherein said gate driving circuit comprises a series circuit of diode means and first resistive means; and second resistive means connected between the gate of said thyristor and a connection point between said diode means and said first resistive means.

5. A voltage detecting circuit according to claim 3, wherein said gate driving circuit comprises a series circuit of first and second resistive means; and third resistive means connected between the gate of said thyristor and a connection point between said first and second resistive means.

6. A voltage detecting circuit according to claim 1, wherein said gate driving circuit comprises a series circuit of diode means and first resistive means, and second resistive means connected between the gate of said thyristor and a connection point between said diode means and said first resistive means.

7. A voltage detecting circuit according to claim 1, wherein said gate driving circuit comprises a series circuit of first and second resistive means and third resistive means connected between the gate of said thyristor and a connection point between said first and second resistive means.

8. A voltage detecting circuit according to claim 1 wherein said light emitting means comprises a light emitting diode which lights up in response to a current larger than a predetermined value supplied from said current supplying means, and said light receiving means comprises a phototransistor which is made conductive in response to the light emitted from said light emitting diode.

9. A voltage detecting circuit according to claim 8, wherein said signal generating means comprises a transistor switching circuit which is made conductive or non-conductive in response to a current flowing through said phototransistor rendered conductive and resistive means connected in series to said transistor switching circuit.

* * * * *

UNITED STATES PATENT AND TRADEMARK OFFICE
CERTIFICATE OF CORRECTION

PATENT NO. : 4,558,226
DATED : December 10, 1985
INVENTOR(S) : Junji TAKADA et al.

It is certified that error appears in the above-identified patent and that said Letters Patent is hereby corrected as shown below:

On the cover page, under the "Assignees" column:

"Toshiba Components Co." should read --Toshiba Components, Co., Ltd.--

Signed and Sealed this

Twenty-eighth Day of April, 1987

Attest:

DONALD J. QUIGG

Attesting Officer

Commissioner of Patents and Trademarks